United States Patent [19]
Re

[11] Patent Number: 5,851,871
[45] Date of Patent: Dec. 22, 1998

[54] PROCESS FOR MANUFACTURING INTEGRATED CAPACITORS IN MOS TECHNOLOGY

[75] Inventor: Danilo Re, Bernareggio, Italy

[73] Assignee: SGS-Thomson Microelectronics, S.r.l., Italy

[21] Appl. No.: 675,520

[22] Filed: Jul. 3, 1996

Related U.S. Application Data

[63] Continuation of Ser. No. 224,106, Apr. 6, 1994, abandoned, which is a continuation of Ser. No. 986,923, Dec. 8, 1992, abandoned, which is a continuation-in-part of Ser. No. 636,558, Jan. 4, 1991, abandoned, which is a continuation of Ser. No. 284,271, Dec. 14, 1988, abandoned.

[30] Foreign Application Priority Data

Dec. 23, 1987 [IT] Italy ...................................... 23200/87

[51] Int. Cl.⁶ .............................................. H01L 21/8242
[52] U.S. Cl. ........................................... 438/250; 438/253
[58] Field of Search ................................... 438/238–239, 438/250–256, 381, 393–398

[56] References Cited

U.S. PATENT DOCUMENTS

| | | | |
|---|---|---|---|
| 4,002,512 | 1/1977 | Lim ........................................... | 427/93 |
| 4,359,490 | 11/1982 | Lehrer ....................................... | 427/95 |
| 4,371,587 | 2/1983 | Peters ....................................... | 428/446 |
| 4,419,385 | 12/1983 | Peters ....................................... | 427/99 |
| 4,441,249 | 4/1984 | Alspector et al. . | |
| 4,459,740 | 7/1984 | Schwabe et al. . | |
| 4,577,390 | 3/1986 | Haken . | |
| 4,589,056 | 5/1986 | Stimmell ................................... | 361/311 |
| 4,604,150 | 8/1986 | Lin ............................................ | 148/188 |
| 4,686,552 | 8/1987 | Teng et al. ................................ | 257/50 |
| 4,794,563 | 12/1988 | Maeda ...................................... | 437/919 |
| 4,810,673 | 3/1989 | Freeman ................................... | 437/239 |
| 4,814,291 | 3/1989 | Kim et al. . | |
| 4,874,716 | 10/1989 | Rao . | |

(List continued on next page.)

FOREIGN PATENT DOCUMENTS

| | | |
|---|---|---|
| 0 183 623 | 6/1986 | European Pat. Off. . |
| 0 208 459 | 1/1987 | European Pat. Off. . |
| 321860A2 | 6/1989 | European Pat. Off. ........ H01L 21/82 |
| 2 131 407 | 6/1984 | United Kingdom . |
| WO 81/00171 | 1/1981 | WIPO . |

OTHER PUBLICATIONS

Sze, VLSI technology, pp. 93–95, 99–100, 107–108, 116, 125–126, 1983.

8257B Journal of Vacuum Science & Technology/Section B vol. 5 No. 6+ index, Woodbury, N.Y., 1987, Low Pressure Deposition of high quality $SiO_2$ films by pyrolysis of tetraethyorthosilicate F.S.Becker, D.Pawlik, H.Anzinger & A.Spitzer, pp. 1555–1563.

Journal of Electroche:society., vol. 126, No. 6 (1979) pp. 1042–1046 The deposition of silicon dioxide films at reduced pressure; A.C.Adams.

(List continued on next page.)

*Primary Examiner*—Jey Tsai
*Attorney, Agent, or Firm*—Felsman, Bradley, Gunter & Dillon, LLP

[57] ABSTRACT

A process for manufacturing integrated capacitors in CMOS technology, comprising the steps of: producing, in a substrate of semiconductor material having a first type of conductivity, at least one well with the opposite type of conductivity, defining the active areas, producing insulation regions, depositing a first conducting layer of polycrystalline silicon adapted to form the gate regions and the lower plates of the capacitors, depositing a layer of silicon oxide at low temperature, to form the dielectric of the capacitors, depositing a second layer of polycrystalline silicon to form the second plate of the capacitors, shaping the polycrystalline silicon and silicon oxide layers, implanting and diffusing the source and drain regions of the CMOS transistors, providing the insulation layer, the metallic connecting layer, and final covering with a layer of protective insulation.

13 Claims, 1 Drawing Sheet

U.S. PATENT DOCUMENTS

| | | | |
|---|---|---|---|
| 4,971,924 | 11/1990 | Tigelaar et al. | 437/60 |
| 5,006,480 | 4/1991 | Chang et al. . | |
| 5,096,847 | 3/1992 | Park et al. | 437/52 |
| 5,173,437 | 12/1992 | Chi | 437/60 |
| 5,244,825 | 9/1993 | Coleman et al. | 437/919 |

OTHER PUBLICATIONS

Solid State Technology, pp. 72–82, Mar. 1981, Stephen C. Su "Low–Temperature Silicon Processing Techniques for VLSIC Fabrication".

Elsevier Science Publishers B.V. (North Holland), 1983 H. L. Peek, Philips Research Laboratories, "The Characterization and Technology of Deposited Oxides for EEPROM".

Wolf, Silicon Processing for VLSI Era, vol. 1, pp. 182–184, 1986.

PROCESS FOR MANUFACTURING INTEGRATED CAPACITORS IN MOS TECHNOLOGY

This is a continuation of application Ser. No. 08/224,106 filed Apr. 6, 1994, now abandoned, which is continuation of Ser. No. 07/986,923 filed Dec. 8, 1992, abandoned, which is continuation-in-part of Ser. No. 07/656,558 filed Jan. 4, 1991 abandoned, which is continuation of Ser. No. 07/284,271, filed Dec. 14, 1988, abandoned.

BACKGROUND OF THE INVENTION

The present invention relates to a process for manufacturing integrated capacitors in MOS technology, in particular in CMOS technology.

As is known, in recent years CMOS technology, and in particular the CMOS technology employing polycrystalline silicon gates (CMOS-SILICON GATE) has made considerable progress, ensuring high integration levels and low power consumption, becoming increasingly common in the production of complex digital circuits of the VLSI generation.

More recently, these advantageous characteristics of CMOS technology have been found useful also for the production of many devices for analog applications.

Good control of the processes in fact allows to obtain a degree of precision and reproducibility of the integrated components which is adequate for the requirements of this class of devices.

One of the components for which considerable precision is required is the capacitor; its main requirements are: small size, precise capacity value, low current loss and most important low voltage coefficient (i.e. low percentual capacity variation according to the voltage applied to the electrodes). In many designs the maximum value required for this last parameter is approximately 20 ppm/volt.

The production of capacitors must furthermore meet the following requirements: it must be implementable within a process currently in production without causing modifications to the other integrated components (transistors, resistors, etc.), it must not cause limitations in the degree of integration in more advanced processes currently being developed (i.e. it must have no effect on design tolerances); and it must entail the smallest possible cost increase.

In particular, the insertion of the capacitor or capacitors within a process for producing CMOS circuits, even in known processes, must be such as to not alter in any way the already performed diffusions of the dopings of the components previously defined on the same substrate.

Capacitors which can be integrated in a CMOS-type silicon-gate circuit are currently manufactured according to one of the following three processes.

According to a first process, MOS-type capacitors are obtained as a secondary product in the CMOS manufacturing process. In particular, one electrode of the capacitor is formed by the silicon substrate and the other is formed by a layer of polycrystalline silicon which is also used to produce the gate regions of the CMOS devices. The dielectric is here formed by the gate oxide layer. This type of capacitor naturally does not affect the rest of the process, since its execution is intrinsic to the normal flow of a CMOS process. However, the problem of this type of capacitor resides in the fact that it has a high voltage coefficient, so that it is absolutely unusable as a capacitor in a precision analog circuit.

A second process produces capacitors similarly to the previous one, with the difference that the lower electrode is formed by a heavily doped region inside the substrate. This second solution requires an additional mask with respect to the known CMOS process, but has no other effect on the process. The production cost of such a capacitor is furthermore modest; however, the voltage coefficient is not always adequate for the levels required by analog applications, as values above 300 ppm/volt are obtained. Consequently it is not always applicable.

The third possibility is to produce capacitors the electrodes whereof are formed by two layers of polycrystalline silicon separated by a layer of oxide obtained by thermal oxidation and forming the dielectric. This type of capacitor, which is in widespread use, meets the necessary requirements in terms of precision, voltage coefficient, relative simplicity and low production cost, but it is not free from disadvantages. In fact in a typical silicon-gate CMOS process all the thermal treatments are appropriately dimensionally defined, and any addition of steps at temperatures capable of diffusing doping species can cause alterations in the produced structures which may compromise the operation of the produced devices. On the other hand the oxidation temperature of the polycrystalline silicon must be higher than 1000° C. (and typically than 1100° C.) in order to obtain low-defect oxides. This thermal treatment actuates a displacement of the doping ion species contained in the insulation regions, facilitating their diffusion in the areas where the transistors are manufactured, as a consequence of the moment in which it is performed (i.e. after the active areas of the transistors are formed).

The effect of these diffusions is to decrease the effective surface of the active areas, having as consequence the so-called "narrowing" effects on the transistors and an unwanted increase of the threshold voltages thereof. While using the minimum-area geometries technology, the above mentioned phenomenon can lead to a failure of the manufactured devices, as these no longer comply with their design specifications.

In order to compensate such effects, it is currently necessary to redefine the parameters of the thermal treatments of the entire process, taking into account those added for the capacitors, this besides requiring long adjustment operations, entailing the need to modify the minimum design tolerances and increasing the minimum width allowed to the transistors. This naturally reduces the integration level of the process.

The article "The characterization and Technology of deposited oxides for EEPROM" by H. L. Peck, published in "Proceedings of international conference INFOS 83", Eindhoven, The Netherlands, 11/13 Apr., 1983, describes a process for producing an insulation layer which can provide for a thermal oxidation in oxygen $O_2$ in a temperature range comprised between 850° and 1150° C., or by LPCVD of silicon dioxide $SiO_2$ from dichlorosilane at 920° C., or by tetraethyl ortho silicate (TEOS) at 730° C.

The latter example seems to be performed at low temperature, but as Peck states:
"In case of TEOS a necessary and optimized densification step was executed in $N_2$ at 1000° C. for 40 min.".
Due to the temperature at which it is performed, this last step of the process assuredly caused alterations in the distribution of the dopings of the transistors which have already been defined.

In order to avoid these problems, it is therefore indispensable to modify the production flow ahead of the forming of the capacitor or capacitors, with easily imaginable costs.

Patent application GB-2131407A, entitled "Method of formation of silicon dioxide layer" in the name of Faraone et al. describes a process which "comprises deporting amorphous silicon, typically by LPCVD from an atmosphere containing silicon in the form of silane diluted with nitrogen, although the other deposition methods are not excluded, where the temperature of the substrate is less than 580° C., typically about 580° C. and 575° C. and preferably about 560° C., subsequently, the amorphous silicon layer is converted to a polycrystalline state by annealing amending at a temperature greater than about 600° C. and preferably about 900° C. and 1000° C.".

This other process also entails steps at high temperature, i.e. between 900° and 1000° C., and therefore cannot be inserted in the flow for the manufacture of a CMOS integrated circuit without either changing the distribution of the dopings of the previously defined devices or changing the flow of the steps which precede the execution of the capacitor.

U.S. Pat. No. 4,874,716 in the name of Rao describes the device of an "interlevel dielectric by LPCVD methods on top of the amorphous n+ poly 1, and then for the annealing on the silicon layer at 1000° C. to crystallize it" which also entails, as in the preceding cases, either a change in the previously performed dopings or a change in the process for the manufacture of the CMOS integrated circuit.

However in a similar manner to Faraone and Rao, the U.S. Pat. No. 4,814,291 by Kim et al. departs from an amorphous silicon layer that is oxidized by "continuous increasing temperature of the amorphous silicon from less than 600° C. to at least 900° C." as clearly explained at Kim's column 4, lines 55/60, or column 6, lines 15/15. Moreover, in example 1 the oxidation temperature is of 1000° C., i.e. a temperature which is similar to the preceding ones and causes the same above described problems, preventing its use within a known flow without modifying the flow itself.

U.S. Pat. No. 4,441,249 in the name of Alspector et al. teaches a high temperature process for manufacturing a capacitor including a first polysilicon layer 17, an oxide layer 18 and a second polysilicon layer 19. While the polysilicon layers are manufactured at a relatively low temperature, the oxidation temperature is of about 1000° C. In particular, Alspector states, column 4 lines 1–7, that in a first embodiment "the oxidation temperature typically is about 1000° C.", while in other embodiments this temperature may be "in the range from about 900° to 1100° C.". The comments to these teachings are similar to the preceding ones, i.e. this process cannot be inserted in a known CMOS integrated circuit manufacture flow without either causing alterations to the devices which are already present or varying the preceding steps of the process.

U.S. Pat. No. 5,006,480 in the name of Chang et al. describes a process for manufacturing a capacitor with a first plate formed by a heavily doped junction and a second plate formed by a metallic layer. This type of capacitor belongs to those previously mentioned types, well-known in the art, which greatly exceed the maximum voltage coefficient of 20 ppm/volt, and is therefore unusable in CMOS integrated circuits characterized by this limit.

In order to clarify what is meant by dopant alteration, it should be noted that the diffusion of dopants due to thermal treatments causes the alteration of junctions present in the silicon and, in addition to changing their local concentration, facilitates their movement toward adjacent regions, i.e. lateral diffusions which are particularly unwanted in the present case. These alterations, especially in structures with minimal tolerances, as CMOS-technology integrated circuits usually are, lead to significant changes in the associated electrical parameters, as is well-known to the experts in the field.

For example, in minimum-width transistors the lateral diffusion of the insulation junctions sets the electrical conductivity of the structure. Therefore, if thermal treatments such as those mentioned in Peck, Faraone, Rao, Kim and Alspector are added in a known manufacturing process, one obtains a narrowing of the transistor and thus a consequent reduction in conductivity.

This effect, which is already per se unwanted, is further worsened by the change in the breakdown voltages of the various junctions, caused by the above described narrowing effect.

All these effects, combined in the same IC, significantly alter its performance with respect to the original operating specifications.

SUMMARY OF THE INVENTION

Given this situation, the aim of the present invention is to provide a process for manufacturing capacitors which solves the shortcomings of the known art and in particular allows to manufacture capacitors having electric characteristics which comply with the specifications, in particular with those relative to the voltage coefficient, and which at the same time do not affect other components of the devices in which they are integrated and do not set lower limits to the minimum obtainable dimensions.

Within the scope of this aim, a particular object of the present invention is to provide a process which produces capacitors with thoroughly controllable electric characteristics complying with the set requirements.

Another object of the present invention is to provide a process which can be inserted within a process or flow for the manufacture of integrated circuits in CMOS technology with no alteration of the structures already present in the device.

Another object of the present invention is to provide a process which can be inserted within a flow for the manufacture of integrated circuits in CMOS technology with no alteration of the manufacturing flow both before and after the insertion point.

Still another object of the present invention is to provide a process which can produce capacitors with stability values equal to, or smaller than, 20 ppm/volt.

Not least object of the present invention is to provide a process which comprises per se well-known and tested process steps to allow the use of machines commonly used in the electronics industry, with controllable results and with a cost comparable to that of the known art.

This aim, these objects and others which will become apparent hereinafter are achieved by a process for manufacturing integrated capacitors in MOS technology, as defined in the accompanying claims.

BRIEF DESCRIPTION OF THE DRAWINGS

Further characteristics and advantages of the invention will become apparent from the description of a preferred but not exclusive embodiment, illustrated only by way of non-limitative example in the accompanying drawings, wherein.

DESCRIPTION OF THE PREFERRED EMBODIMENTS

The process according to the invention initially comprises conventional process steps to manufacture, in a body or substrate 1 of semiconductor material having a first type of conductivity, at least one well 2 with the opposite type of conductivity, by means of an appropriate masking, doping and diffusion step. Said diffusion is normally performed at high temperature (typically 1200° C.) in order to manufacture wells with a considerable junction depth able of accommodating transistors.

Then a layer of inert material (typically silicon nitride) is deposited, masked and shaped so as to define the active areas of the transistors. In particular, the nitride is shaped so as to cover only the active regions in which the transistors are to be provided, leaving free the regions in which the insulations and the field oxide are to be provided. Doping ions adapted to provide a conductivity equal to that of the regions in which they are implanted are subsequently implanted by means of two masking steps in succession, in order to increase their concentration and form insulation regions (channel stoppers).

In these steps the implantations are performed at appropriate energy levels so that, the various areas covered by the inert material which delimits the active areas are shielded.

Figure 1:
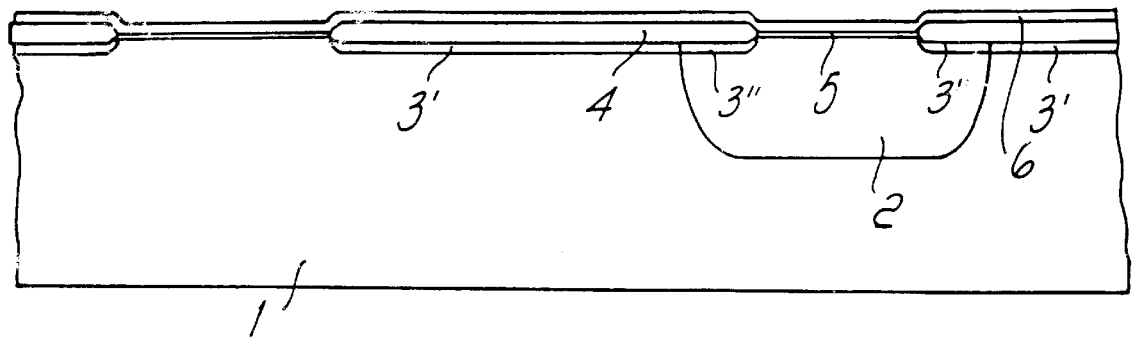
FIGS. 1 to 3 are transverse sectional views through a silicon wafer, illustrating different successive steps of the process according to the invention, in CMOS technology.

Field oxidation is then performed, leading to the forming of a silicon oxide layer indicated by the reference numeral 4 in FIG. 1 only in the regions free from the inert material, simultaneously diffusing all the doping ion species present in the structure, forming the insulation regions 3' in the substrate and 3" in the well. This oxidation is normally performed at temperatures of approximately 1000° C., the effect of displacing the doping species being especially effective in the insulation regions; these doping agents, contrary to those forming the well, have not yet undergone thermal treatments.

The removal of the inert layer and the subsequent thermal oxidation forming gate oxide of the transistors (layer 5) is following. This operation is further followed by the deposition of a first layer of polycrystalline silicon 6 on the entire surface of the silicon wafer and by the doping of this layer. The intermediate structure of FIG. 1 is thus obtained and is thus fully conventional.

This is followed by the process steps leading to the production of the gate electrodes and of the capacitors; in particular the third disclosed process such as known in the art, would entail a masking step to define the gate regions of the transistors and of the lower electrodes of the capacitors, a step of surface thermal oxidation of the polysilicon to form the dielectric of the capacitors, a further deposition of polycrystalline silicon and its doping and shaping in order to delimit the upper plates or the electrodes of the capacitors. However, as mentioned, the thermal oxidation step can lead to a displacement of the doping ion species, producing the already mentioned negative effects.

According to the invention, after depositing the first polycrystalline silicon layer 6, a silicon oxide layer is formed at low temperature. In the present context, "low temperature" means a process temperature at which the dopants present inside the silicon substrate or wafer used for the active components of the CMOS integrated circuit are not affected by any diffusion even if they are subjected to such treatment for sufficiently long times, i.e. equal to, or greater than, one hour.

The function of the dielectric oxide layer is to retain a charge for very short times, i.e. fractions of a second, and what is fundamental from the qualitative point of view is its "extrinsic" defectiveness, i.e. the fact that it must not be conductive for electric charges. Oxides deposited at lower temperatures, such as for example those used in the final passivations of integrated circuits, do not generally provide sufficient assurances if they are subjected to electrical stresses such as those used in circuits which contain both digital and analog integrated components.

In order to obtain oxides with higher quality, i.e. oxides with lower intrinsic defectiveness, said oxides must be subjected to annealing temperatures of at least 1000° C., as in the Peck document, which however cannot be found in a capacitor manufactured according to the present invention.

In detail, according to a preferred embodiment of the invention, the silicon oxide is deposited by oxidation in $O_2$ of tetraethylorthosilicate at 700° C. Due to the relatively low temperature of this process it is thus possible to obtain a film or thin layer of silicon oxide, indicated by 7 in FIG. 2, conveniently acting as dielectric of the capacitors, its manufacturing causing no alterations in the underlying structure.

The process can thus continue conventionally with a subsequent deposition of a layer of polycrystalline silicon and related doping, so as to form a second layer 8 similar to the first layer 6, obtaining a "sandwich" formed by two layers of polycrystalline silicon separated by a film or thin layer of silicon oxide.

The deposition of the layer of polycristalline silicon and the related doping are also performed at low tempeture, without using any capacitor process steps with temperatures for crystallization, embedding and the like of approximately 1000° C., as instead used in the above mentioned prior documents.

In particular, deposition of the second layer 8 can occur in a range of temperatures between 600° C. and 650° C., which are fully irrelevant as regards alterations in the preceding dopings, while doping of the second layer 8 can occur at a temperature between 900° C. and 950° C., with times of 20–30 min, which in any case are irrelevant as regards alterations in the preceding dopings.

In any case, in order to avoid such high temperatures it is possible to perform a "cold" doping, so to speak, by means of the ion implantation method, which in view of the temperatures which are used and well-known from the art assuredly does not alter the diffusion of the prior dopings.

It is furthermore not necessary to subject the first layer 6 to a specific diffusion treatment since, as will become apparent hereinafter, the diffusion steps present in the standard flow for the manufacture of CMOS-technology integrated circuits are used.

Figure 2:
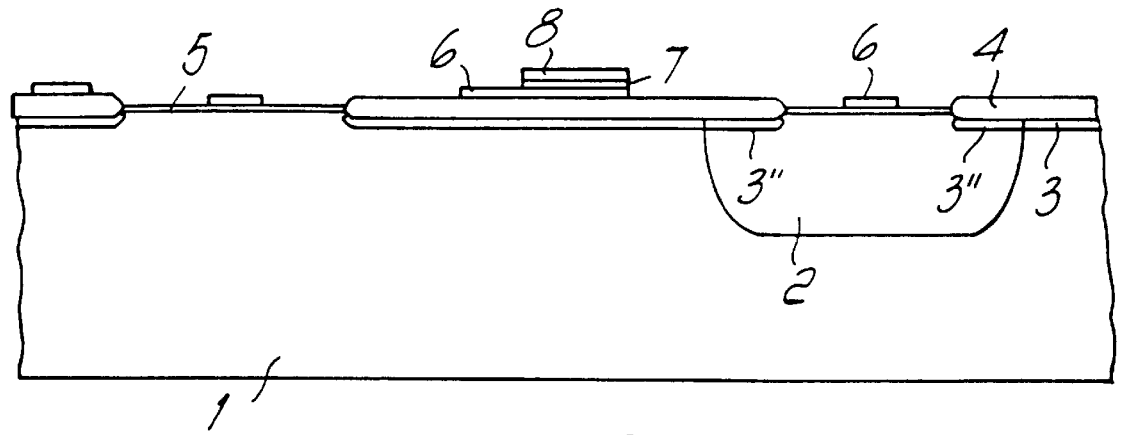

A masking step is then conventionally performed on the second layer 8 of polycrystalline silicon and on the deposited oxide film 7, thus obtaining one of the plates of the capacitors and thus uncovering the surface of the first polysilicon layer 6. A subsequent masking of the first polycrystalline silicon layer 6 defines the gate electrodes of the transistors and simultaneously the second plate of the capacitors. The structure illustrated in FIG. 2 is thus obtained.

Figure 3:
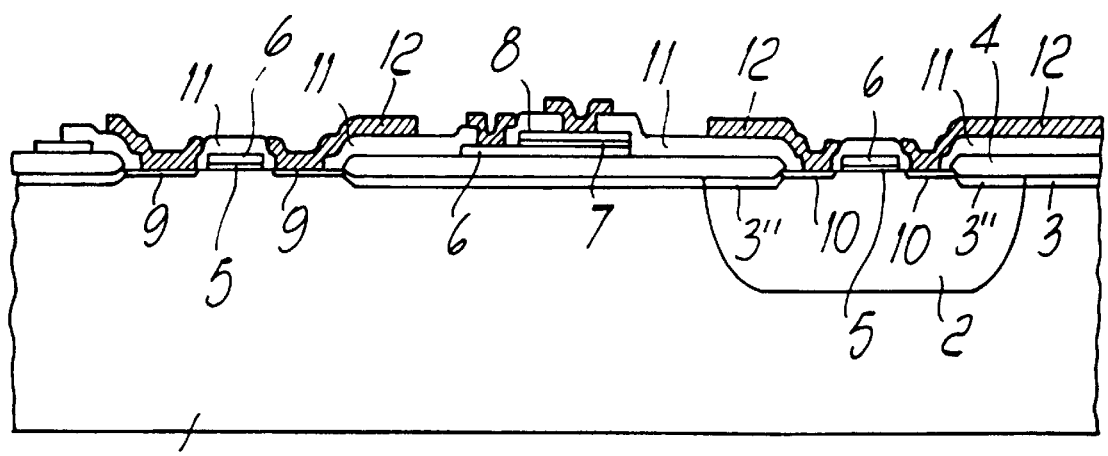

The following process steps comprises two successive masking steps to implant ions in the active areas not covered by polycrystalline silicon to form the source and drain junctions of the transistors. Once the diffusion of the ions implanted in the substrate and in the oppositely doped wells has been performed so as to form the source and drain regions 9 and 10 respectively, the insulating layers are deposited and caused to reflow with an appropriate thermal treatment; consequently the contacts are opened with a masking step, and a metal film or thin layer is deposited and shaped with a second mask, thus obtaining the connections between the various components of the circuit. The structure illustrated in FIG. 3 is thus obtained; said figure illustrates the insulating layer 11 and the metallic layer 12 used for the connections.

In this manner the flow for the manufacture of the CMOS-technology integrated circuit continues, using the well-known steps, and with structures, i.e. transmitters and the like, which are unchanged by the forming of the capacitors.

Finally the entire structure is covered with a final protective insulation layer in which the contact regions of the external connections are opened by masking.

In practice, according to the invention, the oxide interposed between the two plates of the capacitors is obtained by means of a low-temperature process which, by excluding steps at diffusion temperatures, i.e. without any intervening high temperature, excludes alteration in the structures already present on the silicon substrate caused by the displacement of the doping species. Thus, the described method for manufacturing integrated capacitors consists of only low temperature steps.

The process of therefore manufacturing integrated capacitors with low voltage coefficient without altering any of the other structures of the device is extremely advantageous, particularly in view of the development of more advanced processes in which a higher level of integration is required.

The fact that the deposition of the silicon oxide at low temperature, according to the present invention, does not require the alteration of any of the CMOS technology process steps is furthermore advantageous, and the provision of the deposited silicon oxide layer can be added to all commonly known CMOS processes simply by inserting the required operations in the usual production steps.

The fact is stressed that the described embodiment, which consists in a deposition by oxidation of tetraethylorthosilicate in $O_2$, is particularly advantageous as it allows the reduced thicknesses and high uniformity of the dielectric layer required to produce capacitors of appropriate capacity and with the required electric characteristics.

The fact should be furthermore stressed that though several methods for forming silicon oxides at low temperature are known, these methods are currently used in CMOS processes for other purposes (e.g. to form final protection layers, insulation layers between two metallization levels, insulation layers between the polycrystalline silicon layers and the metallic layers) and are not adapted to form the dielectric layer of capacitors due to the high thicknesses obtainable and to their imperfect stoichiometry.

In particular, manufacture of capacitors with the process according to the invention allows to obtain a voltage coefficient equal to, or better still lower than, 20 ppm/volt.

The invention thus conceived is susceptible to numerous modifications and variations, all of which are within the scope of the inventive concept. In particular, the fact is stressed that the described embodiment merely constitutes one possible manner of implementing the invention in a silicon-gate CMOS process, but other sequences of operations can be performed to obtain the resulting structure. The invention is furthermore applicable to capacitors the plates whereof are doped with different methods (such as e.g. by vapors composed of the doping agents for ion implantation or even with other less conventional methods).

The invention furthermore comprises the variation in which the plates of the capacitors are not both provided by means of an appropriately doped polycrystalline silicon layer but are manufactured e.g. one by means of a polycrystalline silicon layer and the other by the metallic layer (typically aluminum) used for the connections. Obviously this solution entails a sequence of operations which is thoroughly different from the one described in the example, but is still based on forming by deposition of silicon oxides at low temperature in order to manufacture the dielectric layer of the capacitors. It is obvious that in this case the above mentioned characteristic is even more important, since the dielectric is manufactured at a more advanced stage of the production process, so that the altering influence of said process is higher on the already manufactured structures.

The fact must furthermore be stressed that the process according to the invention is implementable in the production processes of integrated capacitors in NMOS and PMOS technology, since these can be considered as subsets of the disclosed CMOS process.

It is furthermore stressed that all the technical details may be replaced with other technically equivalent ones.

I claim:

1. A method for manufacturing integrated capacitors for analog applications in MOS technology on a substrate of semiconductor material, consisting only of low temperature steps and starting from a substrate which already bears doping implantations for active components and on which an oxide is already formed, comprising the steps of:

forming, on the oxide, a first conducting layer to form a first plate of a capacitor, wherein the first conducting layer comprises polycrystalline silicon doped in at least a region forming the first plate of the capacitor by low temperature ion implantation;

forming a single capacitor dielectric layer by forming a dielectric material on and in contact with said first conducting material layer using only low temperature during the entire formation of said dielectric layer; and forming a second conducting material superimposed on and in contact with said capacitor dielectric layer to form a second plate of the capacitor, wherein a width of the second conducting material is smaller than a corresponding width of the first conducting layer;

said low temperature not allowing for the displacement of said doping implantation.

2. The method of claim 1, wherein the dielectric material layer is formed by depositing a silicon oxide layer at low temperature.

3. The method of claim 2, wherein said silicon oxide layer is deposited by oxidation of tetraethylorthosilicate in $O_2$ at said low temperature.

4. The method of claim 1, wherein said first and second conducting material layers both comprise doped polycrystalline silicon.

5. The method of claim 1, wherein said first conducting material layer comprises doped polycristalline silicon and said second conducting material comprises a connecting metal layer.

6. The method of claim 3 wherein the deposition of said dielectric is performed as to allow for a voltage coefficient of the capacitor being not greater than 20 ppm/volt.

7. A method for manufacturing integrated capacitors for analog applications in MOS technology on a substrate of semiconductor material, consisting only of low temperature steps and starting from a substrate which already bears doping implantations for active components and on which an oxide is already formed, comprising the steps of:

forming, on the oxide, a first conducting layer comprising polycrystalline silicon doped by low temperature ion implantation;

patterning the first conducting layer to form a first plate of a capacitor and a MOS transistor gate electrode;

forming a single capacitor dielectric layer by forming a oxide on and in contact with said first conducting material layer using only low temperatures less than about 700° C. during the entire formation of said dielectric layer; and forming a second conducting material superimposed on and in contact with said capacitor dielectric layer to form a second plate of the capacitor;

said low temperature not allowing for the displacement of said doping implantation.

8. The method of claim 7, wherein the step of forming a single capacitor dielectric layer further comprises:

oxidizing tetraethylorthosilicate at said low temperature to form said oxide.

9. A method of an integrated circuit including an analog capacitor and a MOS transistor, comprising:

forming an oxide over a substrate containing doped regions for active device components;

forming a polycrystalline silicon layer on the oxide;

implanting ions into the polycrystalline silicon layer;

forming a single capacitor dielectric layer on and in contact with the polycrystalline silicon layer by oxidation of tetraethylorthosilicate using only temperatures less than about 700° C.;

forming a conductive layer on and in contact with the capacitor dielectric layer;

patterning the conductive layer and the capacitor dielectric to form an upper plate and a capacitor dielectric of the capacitor;

patterning the polycrystalline silicon layer to form a lower plate of the capacitor and a gate electrode of the MOS transistor; and implanting impurities in exposed regions of the substrate not covered by the patterned polycrystalline silicon layer to form source and drain regions for the MOS transistor.

10. The method of claim 9, wherein all steps are performed at temperatures less than about 700° C., not allowing for displacement of the doped regions in the substrate.

11. The method of claim 9, wherein the step of forming a conductive layer on and in contact with the capacitor dielectric layer further comprises:

forming a doped polycrystalline silicon layer.

12. The method of claim 9, wherein the step of forming a conductive layer on and in contact with the capacitor dielectric layer further comprises:

forming a metal layer.

13. The method of claim 12, wherein the step of patterning the conductive layer and the capacitor dielectric to form an upper plate and a capacitor dielectric of the capacitor further comprises:

patterning the metal layer to form connections to the source and drain regions of the MOS transistor.

* * * * *